United States Patent
Kitajima et al.

[11] Patent Number: 5,941,759
[45] Date of Patent: Aug. 24, 1999

[54] LAPPING METHOD USING UPPER AND LOWER LAPPING TURNTABLES

[75] Inventors: Kenkichi Kitajima; Kazuo Kubota, both of Nagano, Japan

[73] Assignee: Shin-Etsu Handotai Co., Ltd., Tokyo, Japan

[21] Appl. No.: 08/987,758

[22] Filed: Dec. 9, 1997

[30]    Foreign Application Priority Data

Dec. 19, 1996   [JP]   Japan ................................. 8-339594

[51] Int. Cl.$^6$ ................................................. B24B 1/00
[52] U.S. Cl. ........................... 451/41; 451/36; 451/63; 451/262; 438/692; 438/693
[58] Field of Search ................................. 451/36, 41, 63, 451/262, 264, 267, 268, 269, 270, 271, 286, 287, 290, 291; 438/692, 693

[56]                References Cited

U.S. PATENT DOCUMENTS

| | | | |
|---|---|---|---|
| 1,476,863 | 12/1923 | Weaver | 451/269 |
| 1,491,103 | 4/1924 | Hoke | 451/268 X |
| 1,541,001 | 6/1925 | Searles | 451/269 X |
| 2,944,375 | 7/1960 | Lipkins | 451/268 X |
| 4,272,924 | 6/1981 | Masuko et al. | 451/269 X |
| 4,593,495 | 6/1986 | Kawakami et al. | 451/269 |
| 4,739,589 | 4/1988 | Brehm et al. | 451/269 X |
| 4,996,798 | 3/1991 | Moore . | |
| 5,333,413 | 8/1994 | Hashimoto | 451/269 X |
| 5,762,543 | 6/1998 | Kasprzyk | 451/267 X |

FOREIGN PATENT DOCUMENTS

| | | |
|---|---|---|
| 0 197 214 | 10/1986 | European Pat. Off. . |
| 0 379 214 | 7/1990 | European Pat. Off. . |

*Primary Examiner*—Timothy V. Eley
*Attorney, Agent, or Firm*—Nikaido, Marmelstein, Murray & Oram LLP

[57]                ABSTRACT

In a lapping apparatus including upper and lower lapping turn tables, and disc-shaped workpiece holding fittings which are held rotatably between the upper and lower lapping turn tables and defines a plurality of receiving holes in which flat workpieces are located in the receiving holes, respectively, and the flat workpieces are lapped while the workpieces are moved together with the workpiece holding fittings relative to the upper and lower lapping turn tables, the thickness of the workpiece holding fittings is set to be thinner than a finished thickness of the workpieces with a difference between the thickness of the workpiece holding fittings and the finished thickness of the workpieces being 70 $\mu$m or more.

2 Claims, 5 Drawing Sheets

LAPPING METHOD USING UPPER AND LOWER LAPPING TURNTABLES

BACKGROUND OF THE INVENTION

1. Field of the Invention

The present invention relates to a lapping apparatus which is capable of improving a flatness level of a lapped surface of a flat workpiece such as a semiconductor wafer, etc.

2. Description of the Related Art

Up to now, a method of manufacturing a semiconductor silicon wafer with mirror finished surfaces is generally comprised of: a slicing step to obtain a thin disc-shaped wafer by slicing a single-crystal ingot formed by a pulling step using a crystal pulling machine; a chamfering step to chamfer peripheral edge portions of the thin disc-shaped wafer obtained through the slicing step in order to prevent it from being cracked or broken; a lapping step to flatten the surface of the chamfered wafer by lapping it; an etching step to remove processing damage in the surface of the so chamfered and lapped wafer; a polishing step to finish the etched wafer surfaces into mirror surfaces; and cleaning step to clean the polished wafer.

By the way, the lapping step is made to make the sliced wafer uniform into a predetermined thickness, as well as to obtain a required accuracy in shape such as flatness and parallelism. In general, there has been known that the wafer which has been subjected to the lapping process is the highest in the accuracy of shape, which is considered to decide a final shape of the wafer. Thus, the accuracy in shape in the lapping process is very important.

Also, as the lapping technique, there has been known, up to now, a lapping apparatus that conducts lapping in such a manner that three motions comprised of (1) rotating motion of concentric disc-shaped lapping turn tables, (2) revolving motion of circular fittings for holding workpieces with respect to the lapping apparatus, and (3) rotating motions of the circular holding fittings are combined to give relative motions to the lapping turn tables and the workpieces for lapping. The lapping apparatus is structured, for example, as shown in FIGS. 4 to 6.

FIG. 4 is an exploded perspective view explanatorily showing a lapping apparatus, FIG. 5 is a cross-sectional view explanatorily showing the lapping apparatus, and FIG. 6 is a top view explanatorily showing a state where an upper lapping turn table is removed from the lapping apparatus.

In FIGS. 4 to 6, a lapping apparatus 22 includes a lower lapping turn table 24 and an upper lapping turn table 26 which are disposed vertically opposite to each other. The lower lapping turn table 24 and the upper lapping turn table 26 are allowed to rotate in reverse directions by drive means not shown, respectively.

The lower lapping turn table 24 includes a sun gear 28 on its top surface in the center portion thereof, and an annular internal gear 30 is disposed adjacent to the peripheral edge portion thereof.

Reference numeral 32 denotes disc-shaped workpiece holding fittings (which is generally called "carriers"), and each of the workpiece holding fittings has a gear portion formed on the outer circumferential surface which is meshed with the above sun gear 28 and an internal gear 30, thereby constituting a gear structure as a whole. A plurality of receiving holes 34 are defined in the workpiece holding fittings 32. A workpiece (W) to be lapped such as a wafer is disposed in each of the receiving holes 34.

The workpiece holding fittings 32 are located between the upper and lower lapping turn tables 26 and 24, and a gear formed in the outer periphery of each the workpiece holding fittings 32 is engaged with the sun gear 28 situated in the center of the lower lapping turn table 24 and an internal gear 30 formed in the outer periphery of the lower lapping turn table 24, and the upper lapping turn table 26 is put down on the lower lapping turn table 24. The workpiece holding fittings 32 perform a planetary gear motion between the upper and lower lapping turn tables 26 and 24 that rotate while being opposed to each other. The workpiece (W) is received in each of the receiving holes 34 which are opened in the workpiece holding fittings 32 so that the rotating motion and the revolving motion are given to the workpiece holding fittings 32.

In order to conduct a lapping work, a suspension (A), which is called "slurry", consisting of polishing abrasive grains such as aluminum oxide ($Al_2O_3$) or silicon carbide (SiC) and a liquid such as water containing a surface active agent is allowed to flow from a nozzle 36 via through holes 38 provided in the upper lapping turn table 26 into a gap defined between the upper and lower lapping turn tables 26 and 24 to feed the abrasive grains into a space between the workpiece (W) and the upper and lower lapping turn tables 26 and 24, thus transferring the shapes of the upper and lower lapping turn tables 26 and 24 to the workpiece (W).

In order to obtain a higher flatness level of the workpiece (W), it is required that the shapes of the upper and lower lapping turn tables 26 and 24 are exactly transferred to the workpiece (W) as they are, and therefore the motion of the slurry (A) between the workpiece (W) and the upper and lower lapping turn tables 26, 24 which are relatively moved cannot be ignored.

This is because the abrasive grains in the slurry (A) are constantly worn so that the diameter and the sharpness of grains are changed. If the motion of the slurry (A) is deviated, at a portion where the flow of the slurry (A) is poor, the workpiece is lapped with the abrasive grains which are smaller in diameter and lower in sharpness as compared with other portions, which causes the workpiece to be thickly lapped soon.

For that reason, grooves 40 are dug in the upper and lower lapping turn tables 26 and 24 at intervals of 20 to 50 mm in a square sectioned manner, and a useless slurry (A) or chips are exhausted from the grooves 40. However, this is not sufficient to remove the above problems under the existing circumstances.

In the above-mentioned lapping apparatus, in particular, because the circular workpiece holding fittings 32 that conduct rotation-motion and revolution-motion are exerted by a frictional force accompanied with lapping processing between the upper and lower lapping turn tables 26 and 24, and the workpiece (W), it is formed of a structural component which is very large in strength of the load.

Whereas, for example, in the newest semiconductor processing, the dimensions of the workpiece (wafer) are set such that a ratio of a thickness of the workpiece to an area thereof is very thinned with about 0.7 mm in thickness and 200 mm in diameter. The disc-shaped workpiece holding fittings 32 that hold a plurality of workpieces thus very thinned together make a huge gear which is 600 mm in diameter. On the other hand, the workpiece holding fittings 32 are strictly limited in dimension because the maximum thickness thereof is limited to the maximum thickness of the workpiece.

The thickness of the conventional workpiece holding fittings 32 is generally standardized to be thinned to the degree that it is about two times as much as the maximum grain diameter (about 10 μm) of the abrasive grains in the slurry with respect to the thickness of the workpiece, for example, the wafer. In other words, it is thinner than the thickness of the workpiece by 20 to 40 μm.

Although the above lapping processing is made to improve a flatness level of the workpiece (W), in order to ensure the strength of the workpiece holding fittings 32 which have a gear structure, it was a conventional general operating condition to increase the thickness of the workpiece holding fittings 32 as much as possible within the finished thickness of the workpiece (W). Under this circumstance, the workpieces (W) have been often lapped insufficiently in their surface flatness level. Also, as a wafer has become larger in diameter, a device pattern is progressively fined with the result that a higher flatness level has been required.

The present inventors studied dimensions of workpiece holding fittings that have conventionally caused a problem with an improvement in the quality of various materials and a processing technique in recent years, and investigated dimensions of workpiece holding fittings which improves a flatness level of a lapped workpiece. The present inventors paid attention to a flow of a slurry, and attempted to thin the thickness of the workpiece holding fittings 32 against a conventional taboo in order to smooth the flow of the slurry with the result that the inventors found out that the lapped surface of the workpiece can be improved with setting the thickness of the workpiece holding fittings to be thin within a predetermined range with respect to the workpiece, thus achieving the present invention.

SUMMARY OF THE INVENTION

The present invention has an object to provide a lapping apparatus which is capable of improving a flatness level of the lapped surface of the workpiece such as a semiconductor wafer.

In order to solve the above problems, according to the present invention, there is provided a lapping apparatus which includes upper and lower lapping turn tables, and disc-shaped workpiece holding fittings which are held rotatably between the upper and lower lapping turn tables and defines a plurality of receiving holes, wherein flat workpieces are located in the receiving holes, respectively, and the flat workpieces are lapped while the workpieces are moved together with the workpiece holding fittings relative to the upper and lower lapping turn tables, characterized in that a thickness of the workpiece holding fittings is set to be thinner than a finished thickness of the workpieces with a difference between the thickness of the workpiece holding fittings and the finished thickness of the workpieces being 70 μm or more.

It is preferable that the thickness of the workpiece holding fittings is set to be half or more of the finished thickness of the workpieces, in addition to the condition that the thickness of the workpiece holding fittings is set to be thinner than the finished thickness of the workpieces by at least 70 μm.

In the lapping method according to the present invention, the workpiece is lapped using the above lapping apparatus to improve a flatness level of the lapped surface thereof.

The above and other objects and features of the present invention will be more apparent from the following description taken in conjunction with the accompanying drawings.

DETAILED DESCRIPTION OF THE PREFERRED EMBODIMENTS

Now, a description will be given in more detail of a preferred embodiment of the present invention with reference to the accompanying drawings.

Figure 3:
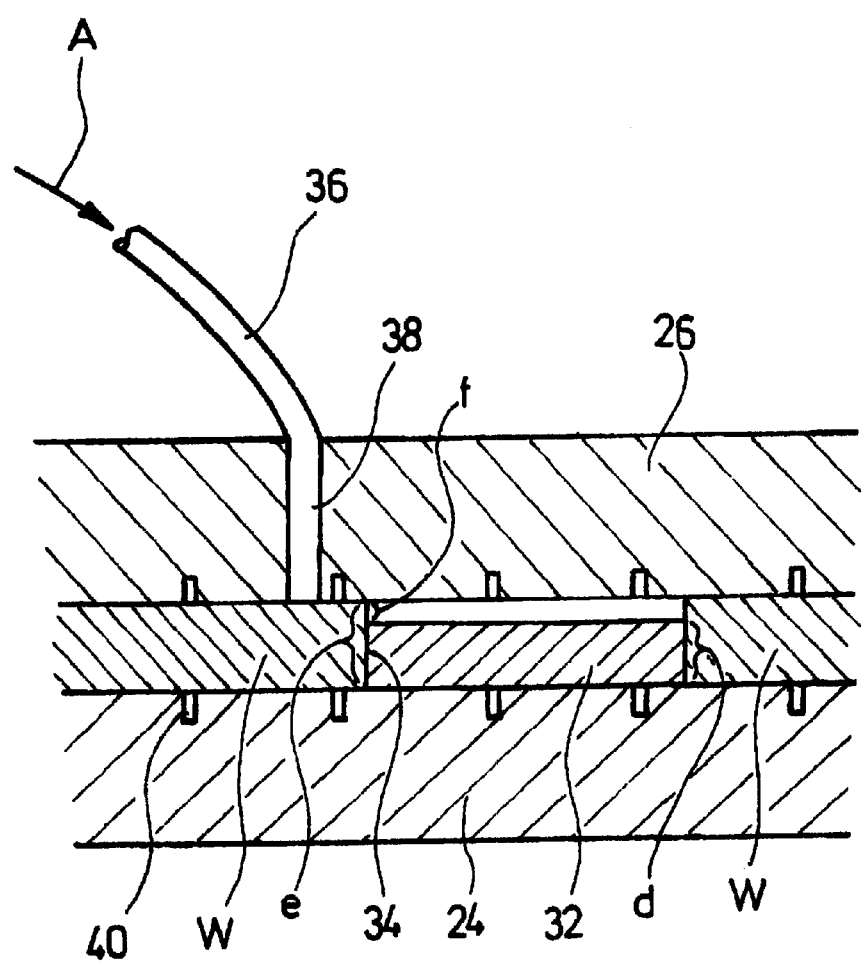
FIG. 3 is a cross-sectional view, on an enlarged scale, explanatorily showing a main portion of a lapping apparatus according to one embodiment of the present invention.

Since the basic structure of a lapping apparatus according to the present invention is not changed from that of the conventional lapping apparatus shown in FIGS. 4 to 6, the re-description of the structure will be omitted, and only the characteristics of the present invention will be described. FIG. 3 is a cross-sectional view, on enlarged scale, showing a main portion of the lapping apparatus in FIG. 4.

In FIG. 3, a thickness (d) of workpiece holding fittings 32 is set to be thinner than a finished thickness (e) of workpieces (W) such as semiconductor wafers. A range of setting the thickness (d) of the workpiece holding fittings 32 is required to set so that a difference (f) between the thickness (d) of the workpiece holding fittings 32 and the finished thickness (e) of the workpiece (W) is 70 μm or more. If the difference (f) between both the thicknesses (d) and (e) is less than 70 μm, the flatness of the lapped surface of the workpiece (W) cannot be sufficiently improved.

If the thickness (d) of the workpiece holding fittings 32 is too thin, there arises a problem on strength. Therefore, the thickness (d) of the workpiece holding fittings 32 is required to have a thickness of half or more of the finished thickness (e) of the workpiece (W).

The present invention will be described below in more detail by way of the following examples.

EXPERIMENTAL EXAMPLE 1

Workpiece (sample wafer): Czochralski-grown, p-type, <100>-oriented, 150-mm-diameter, sliced silicon wafers Abrasive material: aluminum oxide ($Al_2O_3$ #1200)

Slurry supplying volume: 800 cc/min

Lapping load: 100 g/cm$^2$

Lapping time: 15 minutes

Figure 4:
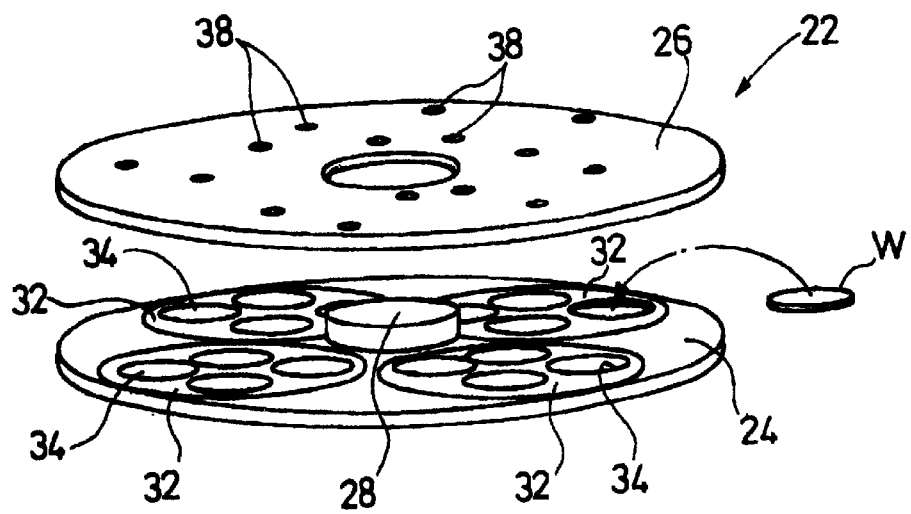
FIG. 4 is an exploded perspective view explanatorily showing the lapping apparatus.
Figure 5:
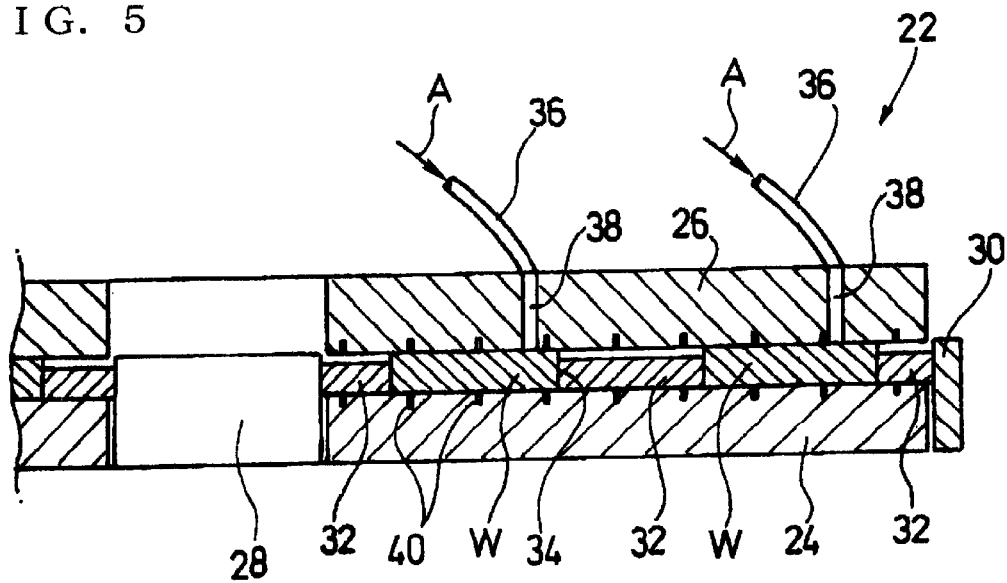
FIG. 5 is a cross-sectional view explanatorily showing the lapping apparatus.
Figure 6:
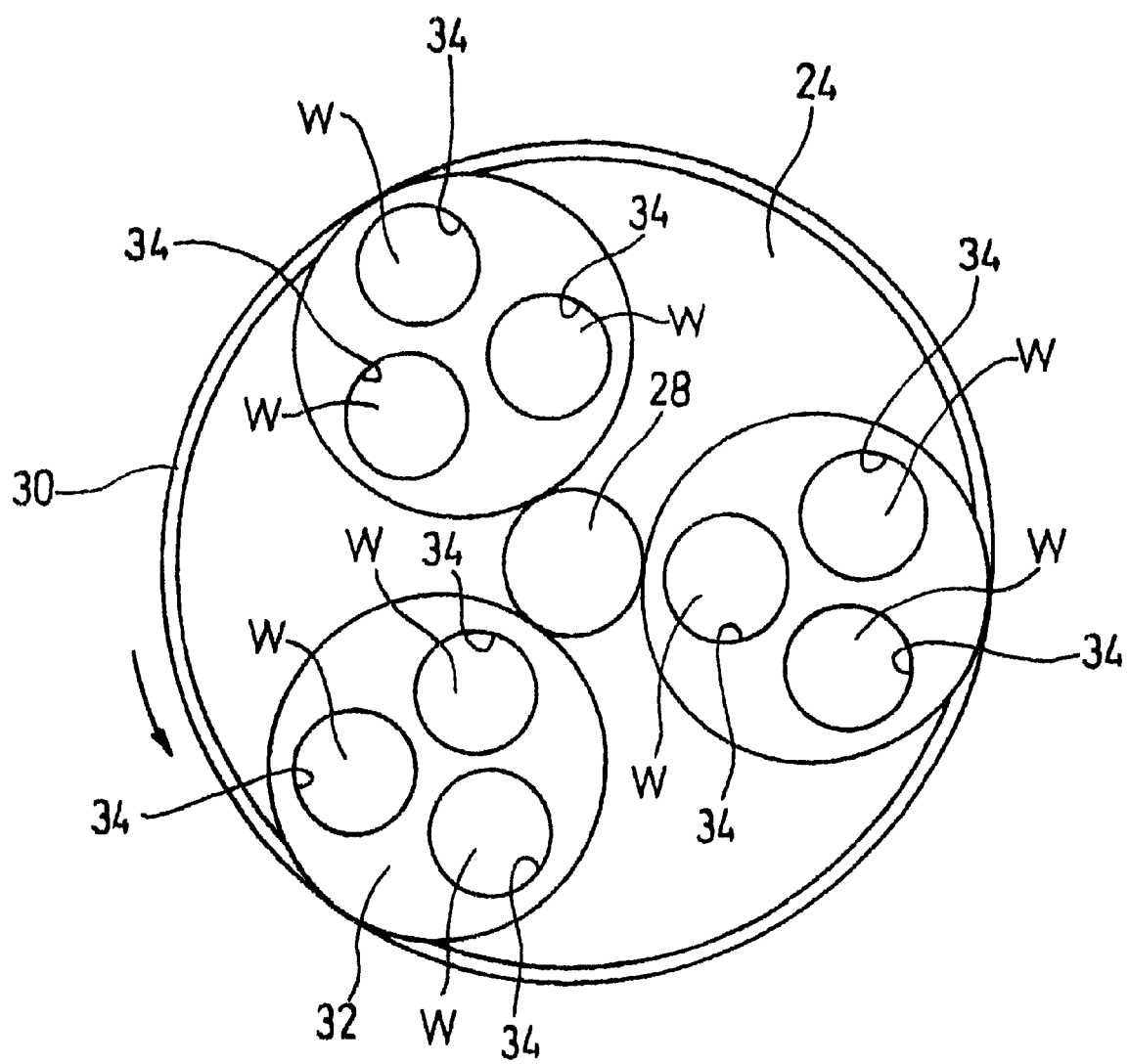
FIG. 6 is a top view explanatorily showing a state where an upper lapping turn table of the lapping apparatus has been removed.

Under the above lapping condition, a difference (D) of the thickness of the workpiece holding fittings (carriers) with respect to the finished thickness of the workpieces (sample wafers)(how much the latter is thinned relative to the former) was changed to 10, 30, 50, 70, 90, 110 and 130 (μm), the sample wafers (the sliced wafers which have been chamfered) were lapped 16 pieces by 16 pieces using the lapping apparatus shown in FIGS. 3 to 5, and the flatness of the lapped surfaces of the sample wafers (TTV: differences between maximum thicknesses and minimum thicknesses in the surfaces) was measured. A mean value of the flatness thus measured is shown in FIG. 1.

Figure 1:
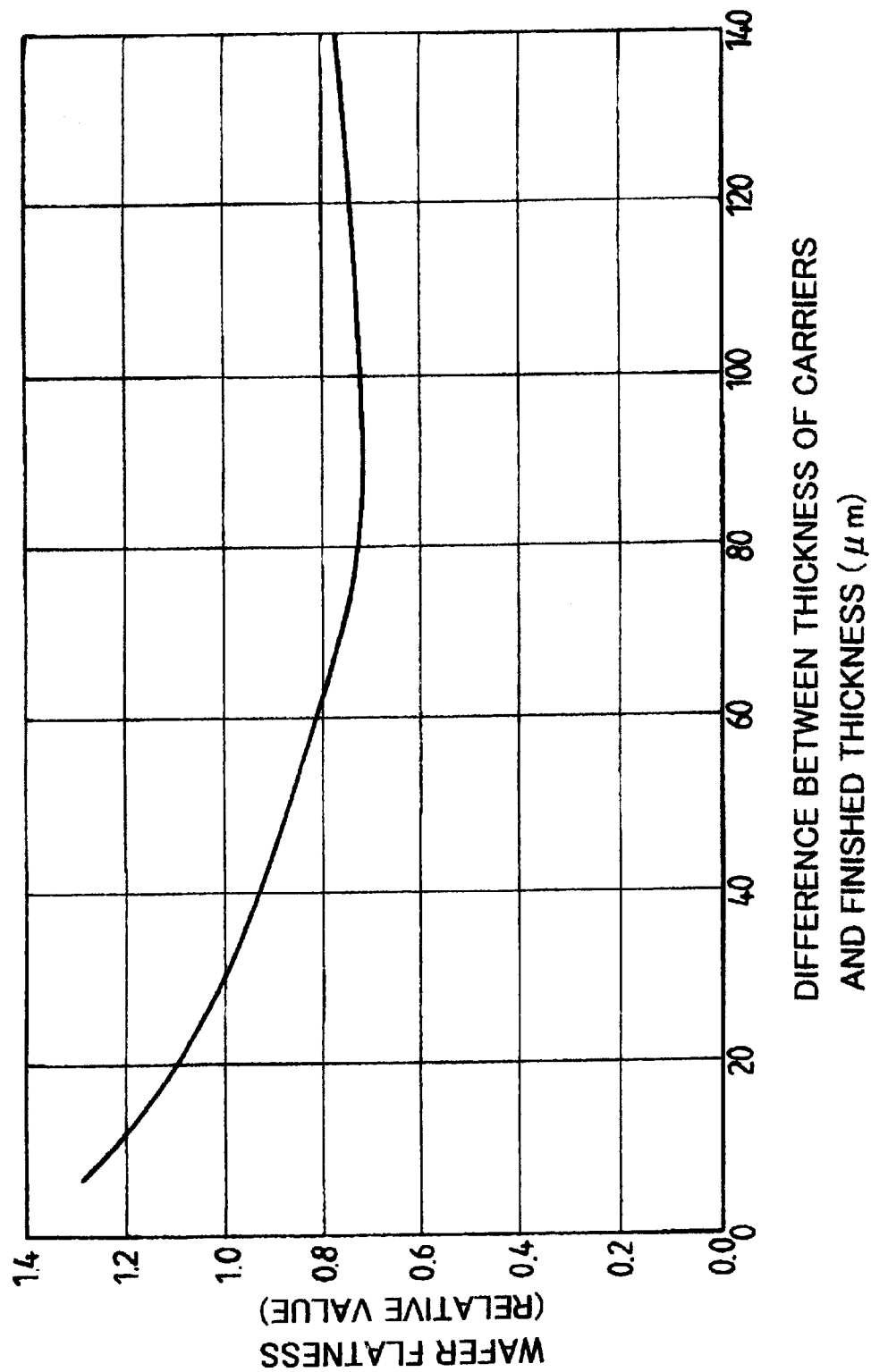
FIG. 1 is a graph representing a relationship between a difference of a thickness of workpiece holding fittings (carriers) relative to a finished thickness of a workpiece (sample wafer), and a flatness of a lapped surface thereof.

As is apparent from the result shown in FIG. 1, in the case where the difference of the thickness of the carrier with respect to the finished thickness of the sample wafer is less than 70 $\mu$m, the flatness of the lapped surface (a relative value when the mean value of the differences 30 $\mu$m between the conventional thicknesses is 1) is 0.8 or more, which is not preferable. However, in the case where the above difference (D) is 70 $\mu$m or more, the flatness (the relative value) is less than 0.8. Thus, an improvement in the flatness could be recognized.

As shown in FIG. 1, since the thickness of the workpiece holding fittings is thinned more, an improved effect of the flatness is substantially not increased when the above difference (D) is about 100 $\mu$m or more. Further, if the workpiece holding fittings are thinned to the degree of half of the finished thickness of the wafer, a chamfered portion of the wafer is liable to run on the workpiece holding fittings so that a lapping operarion per se is not accomplished. For that reason, it was recognized that a limit of an effective range of the thickness of the workpiece holding fittings is half of the thickness of the wafer.

EXAMPLE 1 AND COMPARATIVE EXAMPLE 1

Figure 2:
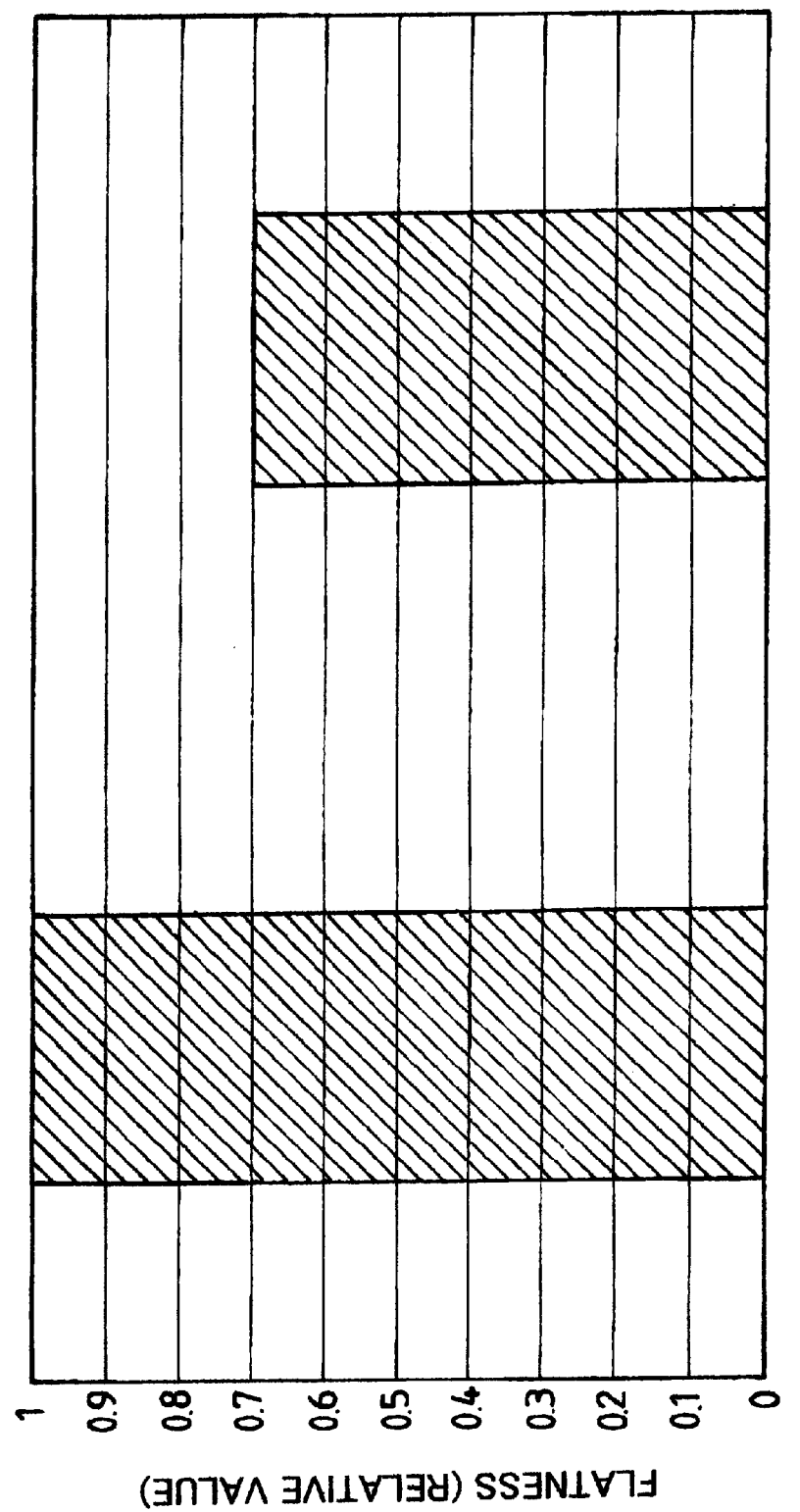
FIG. 2 is a graph representing a flatness of a lapped surface of the workpiece (sample wafer) in Example 1 and Comparative Example 1.

Under the same lapping condition as in Experimental Example 1, the above difference (D) was set to 90 $\mu$m (Example 1) and 40 $\mu$m (Comparative Example 1), the sample wafers were lapped 100 pieces by 100 pieces, and the flatness of the lapped surfaces was measured. A result of mean values of the flatness thus measured is shown in FIG. 2. As shown in FIG. 2, the flatness in Example 1 was 0.7, whereas the flatness in Comparative Example 1 was 1.0. From this result, it was recognized that there was a remarkable difference in quality level therebetween.

As described above, according to the present invention, there can be achieved a great advantage that the flatness of the lapped surface of the workpiece such as the semiconductor wafer or like can be readily improved.

The foregoing description of the preferred embodiments of the invention has been presented for purposes of illustration and description. It is not intended to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A lapping method for semiconductor silicon wafers wherein flat workpieces are lapped using a lapping apparatus which includes upper and lower lapping turntables; and disc-shaped workpiece holding fittings held rotatably between said upper and lower lapping turntables, each fitting having a plurality of receiving holes and a thickness, comprising:

setting the thickness of said workpiece holding fittings to be thinner than a desired finished thickness of the workpieces by at least 70 $\mu$m, locating the flat workpieces in said receiving holes, and lapping the flat workpieces to the desired finished thickness while the workpieces are moved together with said workpiece holding fittings relative to said upper and lower lapping turntables to improve a flatness level of the lapped surface of the workpieces.

2. A lapping method, as claimed in claim 1 wherein the thickness of each of the workpiece holding fittings is set to be at least half of the desired finished thickness of the workpieces.

* * * * *